United States Patent [19]

Stryer

[11] 4,404,530
[45] Sep. 13, 1983

[54] PHASE LOCKED LOOP WITH COMPENSATION FOR LOOP PHASE ERRORS

[75] Inventor: Arthur N. Stryer, Winchester, Mass.

[73] Assignee: Data General Corporation, Westboro, Mass.

[21] Appl. No.: 199,659

[22] Filed: Oct. 22, 1980

[51] Int. Cl.³ .............................................. H03L 7/08
[52] U.S. Cl. ..................... 331/1 A; 331/11; 331/14; 331/16; 331/17; 331/25
[58] Field of Search .............. 331/1 A, 10, 11, 12, 331/14, 16, 17, 18, 25; 360/51; 455/260; 375/120; 329/122, 124

[56] References Cited

U.S. PATENT DOCUMENTS

| | | | |
|---|---|---|---|
| 3,321,712 | 5/1967 | Frisch et al. | 331/17 X |
| 3,832,713 | 8/1974 | Rubin | 331/17 X |
| 3,852,681 | 12/1974 | Underhill | 331/10 X |
| 4,069,462 | 1/1978 | Dunn | 331/11 |
| 4,107,624 | 8/1978 | Turner | 331/10 X |
| 4,191,976 | 3/1980 | Braun | 331/12 X |
| 4,246,545 | 1/1981 | Reisfeld | 331/17 X |

OTHER PUBLICATIONS

Routledge et al., "A Phase-Locked-Loop Phase-Shifter for Band-Limited Signals", The Radio and Electronic Engineer, vol. 47, pp. 117-120, Mar. 1977.

*Primary Examiner*—Siegfried H. Grimm
*Attorney, Agent, or Firm*—Joel Wall; Jacob Frank; Irving M. Kriegsman

[57] ABSTRACT

A phase-locked loop circuit is disclosed for use, for example, in the data recovery system of a rotating magnetic disk drive unit employing a phase encoded signal format. The phase-locked loop circuit has a dual mode of operation wherein captive range is assured by providing a first frequency locking mode of operation wherein a voltage controlled oscillator (VCO) is first locked in frequency to a reference signal and a second phase locking mode of operation wherein the VCO is subsequently locked in phase to an MFM signal independently of the frequency assumed by the latter signal. In addition to the VCO, the phase-locked loop circuit includes a frequency detector, a phase detector, a filter, an amplifier, a pair of frequency dividers, a pulse shaping network and a plurality of switches. A potentiometer is coupled to the input of the amplifier and is used to supply a voltage signal to the amplifier which is sized to offset system phase errors caused by the various components in the phase-locked loop circuit. Because system phase errors are minimized, data can be stored and accurately recovered using smaller sized bit cells than would otherwise be possible, resulting in high disk recording frequencies and high density recording.

2 Claims, 1 Drawing Figure

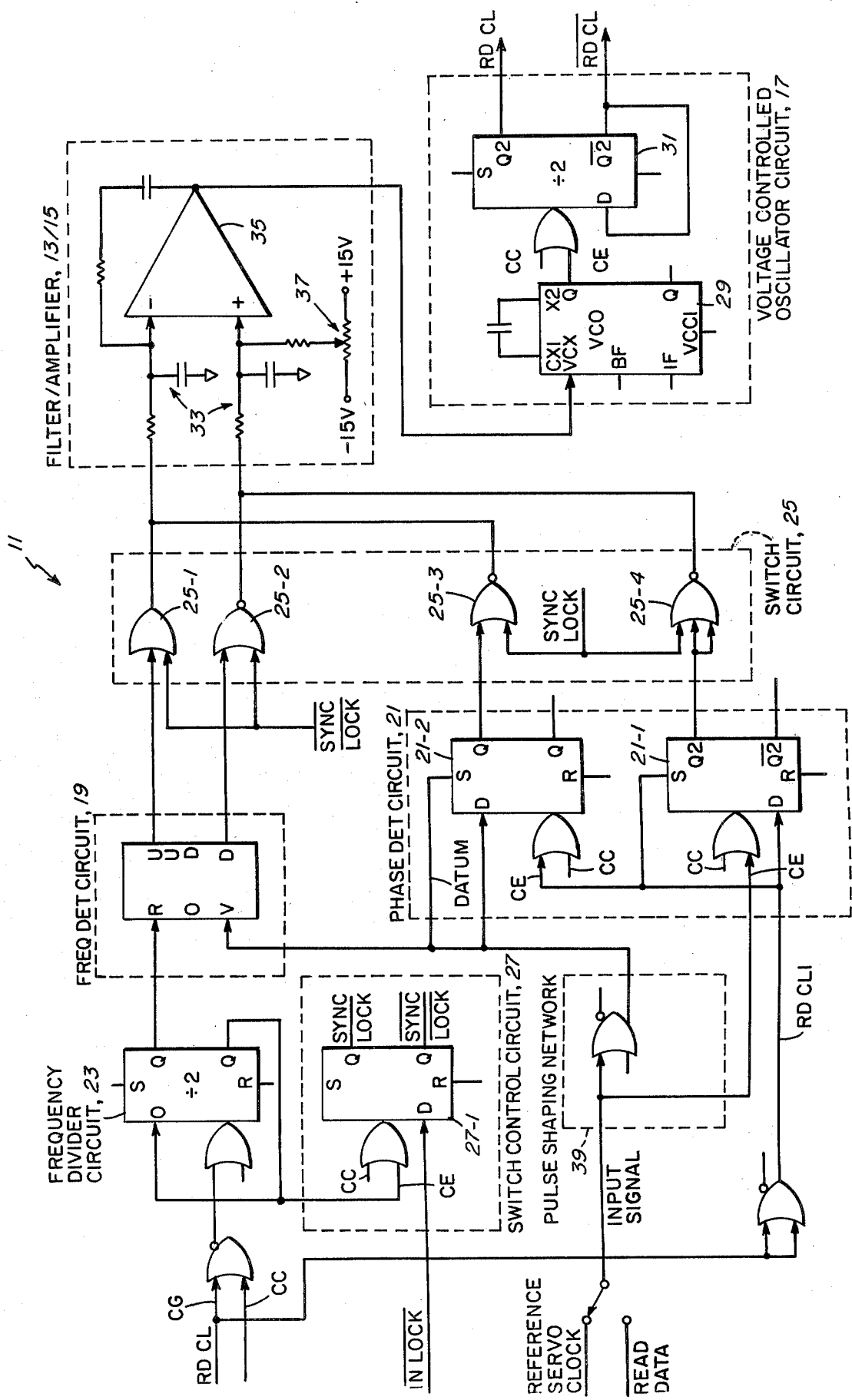

PHASE LOCKED LOOP WITH COMPENSATION FOR LOOP PHASE ERRORS

BACKGROUND OF THE INVENTION

The present invention relates generally to a phase-locked loop circuit and, more particularly, to a phase-locked loop circuit for providing phase synchronization between a first signal and a second signal in which system phase errors caused by the components in the phase-locked loop circuit are minimized to assure accurate phase synchronization of the two signals.

Phase-locked loop circuits are well-known in the art and are used in a variety of applications. Basically a phase-locked loop circuit includes a phase detector, a low pass filter and a voltage controlled oscillator. By controlling the phase of the oscillator output signal, the loop is capable of locking to, or synchronizing with, the phase of an incoming signal.

Phase-locked loop circuits are commonly used in digital data systems to provide a data clock locked in phase synchronization with data bits in a serial digital data stream, the data clock being phase-locked to either a separate input clock signal or to the data bits of the data stream itself. In general, a phase detector circuit compares input and clock signals and provides a control signal to a voltage-controlled oscillator (VCO) generating the clock signal. The control signal controls frequency and phase of the clock signal in such a manner that clock and input signals are locked in phase synchronization. Thus, input data streams containing consecutive ones or zeros are, in MFM code, distinguished by the positions of the data bits in the data cells, i.e., near the centers or the edges of the cells. Data clock must therefore be correctly phase synchronized to the data cells to allow ones and zeros to be distinguished to provide the proper decoded data output.

In U.S. Pat. No. 4,069,462, to D. Dunn, which patent is incorporated herein by reference, there is described a phase-locked loop which may be used in the data recovery system of a rotating magnetic disk drive unit. The loop produces a signal which is in phase synchronism with an input signal which may assume multiple, but integrally related, frequencies. The loop operates with a dual mode of operation wherein frequency capture is first achieved utilizing a suitably selected frequency detector circuit and phase capture is subsequently achieved utilizing a separate, suitably selected phase detector circuit. In the initial frequency capture mode, lock-in to the frequency of a suitably selected reference signal is provided by the frequency detector circuit which is utilized as part of a closed loop so as to bring a signal derived from a voltage controlled oscillator into frequency synchronization with the reference signal, the frequency of which has a known integral relationship to the multiple frequencies of the input signal. The loop is then switched to its second mode of operation utilizing a phase detector circuit as part of the same closed loop so as to bring the phase of a signal derived from the voltage controlled oscillator signal into synchronization with the phase of the input signal independently of the frequency which the latter signal assumes. This process provides only phase synchronization so that the phase lock-up time is predictable and data storage capacity is optimized.

Another example of a phase-locked loop for use in the data recovery system of a rotating magnetic disk drive unit is described in U.S. Pat. No. 4,191,976, to W. A. Braun, which patent is also incorporated herein by reference. In the Braun patent, the circuit includes a phase difference measuring circuit providing a first signal proportional to phase difference between input pulse train and clock pulse train, the signal having related discontinuities at the points of minimum and maximum phase difference between input and clock pulse trains. A second signal is generated representing a selected value of phase difference, the selected value being greater than the minimum phase difference and less than the maximum phase difference. First and second signals are then compared to provide a signal representing difference between the measured and selected values of phase difference. The comparison signal thereby avoids the discontinuities at minimum and maximum values of phase difference by representing phase relationship between input and clock pulse trains relative to the selected value of phase difference rather than to the maximum or minimum values.

In the past, very little attention has been paid to the problem of system phase errors in the phase-locked loop; that is, fixed or steady state phase errors produced by the various components used in the phase-locked loop. The principal reason for the lack of concern over this problem has been that the density of the data stored on the disk has been at levels, i.e. around 4040 bits per inch or cell periods of around 155 nanoseconds apart, wherein the bit cell is considerably larger than the system phase errors. Consequently, the system phase errors have very little effect on the data integrity. As the density of the data stored on the disk increases, however, the length of the bit cell relative to the system phase errors becomes more and more of a problem and as a result becomes a limiting factor in the amount of data that can actually be stored and accurately recovered. Thus, it can be appreciated, that in order to store data and retrieve it reliably at high density levels, such as around 6060 bits per inch or at cell periods of around 103 nanoseconds, a phase-locked loop is needed in which the system phase errors are minimized.

Accordingly, it is an object of this invention to provide a new and improved phase-locked loop.

It is another object of this invention to provide a phase-locked loop for use in the data recovery system of a magnetic disk drive unit.

It is still another object of this invention to provide a phase-locked loop for use in the data recovery system of a magnetic disk drive unit employing a phase encoded signal format.

It is yet still another object of this invention to provide a phase-locked loop for use in the data recovery system of a magnetic disk drive unit employing a phase encoded signal format in which system phase errors are minimized.

It is another object of this invention to provide a phase-locked loop for use in a data recovery system of a magnetic disk drive unit in which data can be accurately stored on the disk at density levels of 6060 bits per inch or cell periods of 103 nanoseconds, or higher, and then reliably recovered.

It is still another object of this invention to provide a technique for minimizing system phase errors in a phase-locked loop circuit which is simple, economical and highly reliable.

The present invention provides a phase-locked loop which accomplishes the above and other objects.

SUMMARY OF THE INVENTION

A phase-locked loop circuit constructed according to the teachings of this invention includes a phase detector, a filter/amplifier combination and a voltage controlled oscillator circuit. The filter/amplifier combination has its input coupled to the output of the phase detector and includes a low pass filter and an amplifier. The output of the filter/amplifier combination is coupled to the input of the voltage controlled oscillator circuit and the output of the voltage controlled oscillator circuit is connected in feedback to the input of the phase detector. A potentiometer is coupled to the input of the amplifier and is used to provide a small voltage signal to the amplifier which is sized to offset the steady state bias caused by the various components in the phase-locked loop circuit.

BRIEF DESCRIPTION OF THE DRAWINGS

The invention can be best understood with the help of the accompanying drawing where the sole FIGURE is a block diagram, partly in schematic form, of a phase-locked loop circuit constructed according to the teachings of the present invention.

DETAILED DESCRIPTION OF PREFERRED EMBODIMENT

The present invention is directed to a phase-locked loop circuit in which system phase errors which could adversely effect the usefulness of the phase-locked loop circuit in certain applications are minimized by introducing into the circuit a small voltage which is sized and is of the proper polarity to offset the steady state bias caused by the various components in the circuit. The small offsetting voltage is fed in the circuit through a potentiometer which is connected to a suitable supply voltage.

In order to better understand the invention, the phase-locked loop circuit will hereinafter be described for use in a data recovery system of a rotating magnetic disk drive unit employing an MFM encoded signal format in which the phase-locked loop circuit is used to generate a "read clock" signal which is locked in phase with the data input which is read from the recording disk. It should be understood, however, that the invention is not intended to be limited to this particular application.

Referring now to the drawings, there is shown a phase-locked loop circuit constructed according to the teachings of this invention and identified generally by reference numeral 11.

As can be seen, phase-locked loop circuit 11 includes a low pass filter/amplifier combination 13/15 which supplies a control voltage to a voltage controlled oscillator circuit 17. The error input to voltage controlled oscillator circuit 17 is supplied from one of two detector circuits, one detector circuit 19 being a frequency detector circuit and the other detector circuit 21 being a phase detector circuit. An output signal derived from voltage controlled oscillator circuit 17 is supplied as an input to frequency detector circuit 19 through a frequency divider circuit 23 and to phase detector circuit 21. The frequency detected and phase detected outputs from detector circuits 19 and 21 are supplied to filter/amplifier 13/15 through a switching circuit 25 since only one of the outputs is connected to filter/amplifier 13/15 at one time. Switching circuit 25 is controlled through a switch control circuit 27.

Phase-locked loop circuit 11 operates in the same manner as the phase-locked loop circuit described in the above-noted U.S. Pat. No. 4,069,462, and, except for the difference in construction in filter/amplifier 13/15 and other differences as hereinafter pointed out, is similar in construction to the phase-locked loop circuit described in U.S. Pat. No. 4,069,462.

Voltage controlled oscillator circuit 17 includes a voltage controlled oscillator 29, which may be in the form of a Motorola chip number 1658, and a frequency divider 31, which may be in the form of a D type flip-flop circuit, such as a Motorola chip number 10131. Frequency detector 19 comprises a phase-frequency detector and may be in the form of a Motorola chip number 12040. Phase detector circuit 21 comprises a pair of D type flip-flop circuits 21-1 and 21-2, each of which may be a Motorola chip number 10131. Frequency divider circuit 23 is of the same type as frequency divider circuit 31. Switching circuit 25 comprises four logic gates identified by reference numerals 25-1 through 25-4. Switch control circuit 27 comprises a D type flip-flop circuit 27-1 and may be a Motorola chip number 10131.

Filter amplifier circuit 13/15 includes a pair of resistance-capacitance filter circuits 33 which function as a transient suppressor and whose outputs are fed into an operational amplifier 35 and an adjustable potentiometer 37 whose movable arm is connected to one of the inputs of operational amplifier 35 and whose main leg is connected to a +15 volt supply voltage.

Operational amplifier 35 is of the type having low input offset voltage characteristics and superior performance characteristics and may comprise a National Semiconductor chip number LF 356B.

Potentiometer 37 may be in the form of a 20,000 ohm potentiometer and is adjusted so as to supply a voltage at the input of operational amplifier 35 which offsets system phase errors (i.e. the bias level at the input of operational amplifier 35) produced by the various components in the loop. The components which may cause the phase errors are primarily flip-flops 21-1 and 21-2 in phase detector circuit 21, switches 25-1 through 25-4 in switch circuit 25, the resistors in filters 33 and operational amplifier 35. The particular setting of potentiometer 37 may be determined by inserting a constant frequency into phase-locked loop circuit 11, observing the phase difference between the signals traveling along lines RDCL1 and DATUM, using an oscilloscope and then adjusting the potentiometer until the two signals are in phase with one another.

Finally, phase-locked loop circuit 11 includes a pulse shaping network 39.

Various modifications may be made without departing from the spirit and scope of the invention. Thus, the present embodiment is to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. In a phase-locked loop circuit for use in a data recovery system of a rotating magnetic disk drive unit employing a phase encoded signal format and including a phase detector, a filter coupled to the output of the phase detector, an operational amplifier coupled to the filter and a voltage controlled oscillator coupled to the output of the operational amplifier, in which the phase detector compares an input signal with the output signal of the voltage controlled oscillator and provides a control signal to the voltage controlled oscillator, the improvement comprising: adjustable voltage means for supplying a voltage signal to said operational amplifier sized to offset phase errors caused by the components in said phase locked loop circuit, said adjustable voltage means comprising a positive supply voltage source, a negative supply voltage source and a potentiometer, said potentiometer having a movable arm connected to an input of said operational amplifier and a main leg connected at one end to said positive supply voltage source and at the other end to said negative supply voltage source.

2. A system for providing phase synchronism between a first signal and a second signal comprising:
 a. means for comparing the frequency of a reference signal with the frequency of a feedbak signal derived from said second signal to produce a first difference signal representing the frequency difference therebetwen;
 b. filter and amplifying means including a filter, an operational amplifier having low input offset voltage characteristics, adjustable voltage means for supplying an adjustable voltage signal sized to offset phase errors, said adjustable voltage means comprising a positive supply voltage source, a negative supply voltage source and a potentiometer, said potentiometer having a movable arm connected to a noninverting input of said operational amplifier and a main leg connected at one end to said positive supply voltage source and at the other end to said negative supply voltage source;
 c. switching means between said frequency comparing means and said filter and amplifying means for supplying said first frequency difference signal to said filter and amplifying means, said later means thereby providing a first control signal representing said frequency difference;
 d. oscillator means responsive to said first control signal for producing said second signal, the frequency of said second signal being controlled by said first control signal so that said frequency difference is minimized so that the frequency of said feedback signal derived from said second signal is in substantial synchronism with the frequency of said reference signal;
 e. means for comparing the phase of said second signal with the phase of said first signal to produce a second difference signal representing the phase difference therebetween; and
 f. means for actuating said switching means to supply said second phase difference signal to said filter and amplifying means and to prevent said first frequency difference signal from being supplied thereto when said substantial frequency synchronism has been achieved, said filter and amplifying means thereby providing a second control signal;
 g. said oscillator means being responsive to said second control signal so that said phase difference is minimized and the phase of said second signal is in substantial in-phase synchronism with the phase of said first signal.

* * * * *